US012237348B2

(12) United States Patent
Togashi et al.

(10) Patent No.: US 12,237,348 B2
(45) Date of Patent: Feb. 25, 2025

(54) IMAGING DEVICE AND RANGING SYSTEM

(71) Applicants: Sony Group Corporation, Tokyo (JP);
Sony Semiconductor Solutions Corporation, Kanagawa (JP)

(72) Inventors: Hideaki Togashi, Kanagawa (JP);
Kaori Takimoto, Kanagawa (JP);
Masahiro Segami, Kanagawa (JP); Kei Nakagawa, Kanagawa (JP); Nobuhiro Kawai, Kanagawa (JP)

(73) Assignees: Sony Group Corporation, Tokyo (JP);
Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/546,684

(22) PCT Filed: Feb. 22, 2022

(86) PCT No.: PCT/JP2022/007398
§ 371 (c)(1),
(2) Date: Aug. 16, 2023

(87) PCT Pub. No.: WO2022/190867
PCT Pub. Date: Sep. 15, 2022

(65) Prior Publication Data
US 2024/0145496 A1     May 2, 2024

(30) Foreign Application Priority Data
Mar. 12, 2021  (JP) .................................. 2021-040358

(51) Int. Cl.
*H01L 27/146*   (2006.01)
*H04N 25/705*   (2023.01)
*H04N 25/77*    (2023.01)

(52) U.S. Cl.
CPC .. *H01L 27/14605* (2013.01); *H01L 27/14669* (2013.01); *H04N 25/705* (2023.01); *H04N 25/77* (2023.01)

(58) Field of Classification Search
CPC .................................................. H01L 27/14665
See application file for complete search history.

(56) References Cited

U.S. PATENT DOCUMENTS

2013/0229491 A1   9/2013  Kim
2019/0295279 A1*  9/2019  Wang ...................... G06T 7/586
(Continued)

FOREIGN PATENT DOCUMENTS

JP    2015050331 A    3/2015
JP    2016005189 A    1/2016
(Continued)

OTHER PUBLICATIONS

Translation of JP-2020170966. (Year: 2020).*
International Search Report (PCT/ISA/210), International Application No. PCT/JP2022/007398, dated May 24, 2022.

Primary Examiner — Thanh Luu
(74) Attorney, Agent, or Firm — Michael Best & Friedrich LLP

(57) ABSTRACT

Imaging devices and ranging devices are disclosed. In one example, an imaging device includes a semiconductor substrate, a first pixel array, a second pixel array, and a control unit. In the first pixel array, a first light receiving pixel on the semiconductor substrate has a stacked structure of a first electrode, a photoelectric conversion layer, and a second electrode (80). It photoelectrically converts light in a first wavelength region including the visible light region. In the second pixel array, a second light receiving pixel is provided at a position overlapping the first light receiving pixel in a thickness direction of the semiconductor substrate. It photoelectrically converts light in a second wavelength region (Continued)

including the infrared light region. The control unit drives and controls the second pixel array based on a signal photoelectrically converted by the first pixel array.

8 Claims, 11 Drawing Sheets

(56) References Cited

U.S. PATENT DOCUMENTS

2020/0412980 A1\* 12/2020 Agranov ........... H01L 27/14609
2022/0271073 A1    8/2022 Togashi

FOREIGN PATENT DOCUMENTS

| | | | |
|---|---|---|---|
| JP | 2018136123 A | | 8/2018 |
| JP | 2018142838 A | | 9/2018 |
| JP | 2020170966 A | \* | 10/2020 |
| JP | 2021022875 A | | 2/2021 |
| WO | WO-2014178836 A1 | | 11/2014 |
| WO | WO-2014204993 A1 | | 12/2014 |
| WO | WO-2020255999 A1 | | 12/2020 |

\* cited by examiner

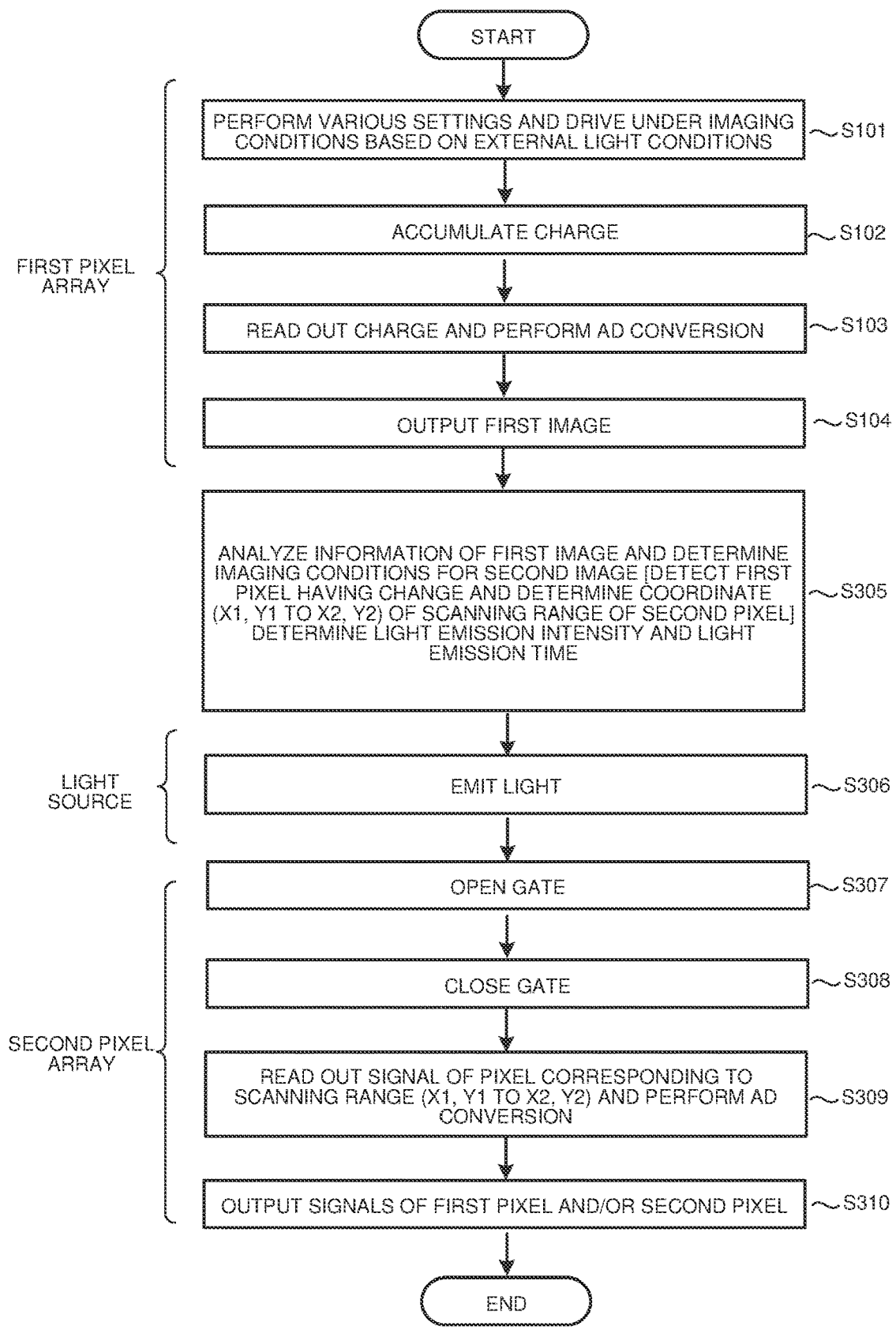

IMAGING DEVICE AND RANGING SYSTEM

FIELD

The present disclosure relates to an imaging device and a ranging system.

BACKGROUND

There is an imaging device formed by stacking a pixel array that captures a visible light image and a pixel array that captures an infrared light image. Such an imaging device includes a device that controls imaging of the visible light image using information of the infrared light image (refer to, for example, Patent Literature 1).

CITATION LIST

Patent Literature

Patent Literature 1: JP 2018-142838 A

SUMMARY

Technical Problem

However, information of the visible light image is not effectively used in the above-described conventional technique.

Therefore, the present disclosure proposes an imaging device and a ranging system that can effectively use the information of the visible light image.

Solution to Problem

According to the present disclosure, an imaging device is provided. The imaging device includes a semiconductor substrate, a first pixel array, a second pixel array, and a control unit. In the first pixel array, a first light receiving pixel that is provided on the semiconductor substrate, has a stacked structure in which a first electrode, a photoelectric conversion layer, and a second electrode are sequentially stacked, and photoelectrically converts light in a first wavelength region including the visible light region is two-dimensionally arrayed. In the second pixel array, a second light receiving pixel that is provided at a position overlapping the first light receiving pixel in the semiconductor substrate in the thickness direction of the semiconductor substrate, and photoelectrically converts light in a second wavelength region including the infrared light region is two-dimensionally arrayed. The control unit drives and controls the second pixel array based on a signal photoelectrically converted by the first pixel array.

BRIEF DESCRIPTION OF DRAWINGS

FIG. 13 is a flowchart illustrating an example of processing executed by an imaging device according to the modification of the present disclosure.

DESCRIPTION OF EMBODIMENTS

Figure 1:
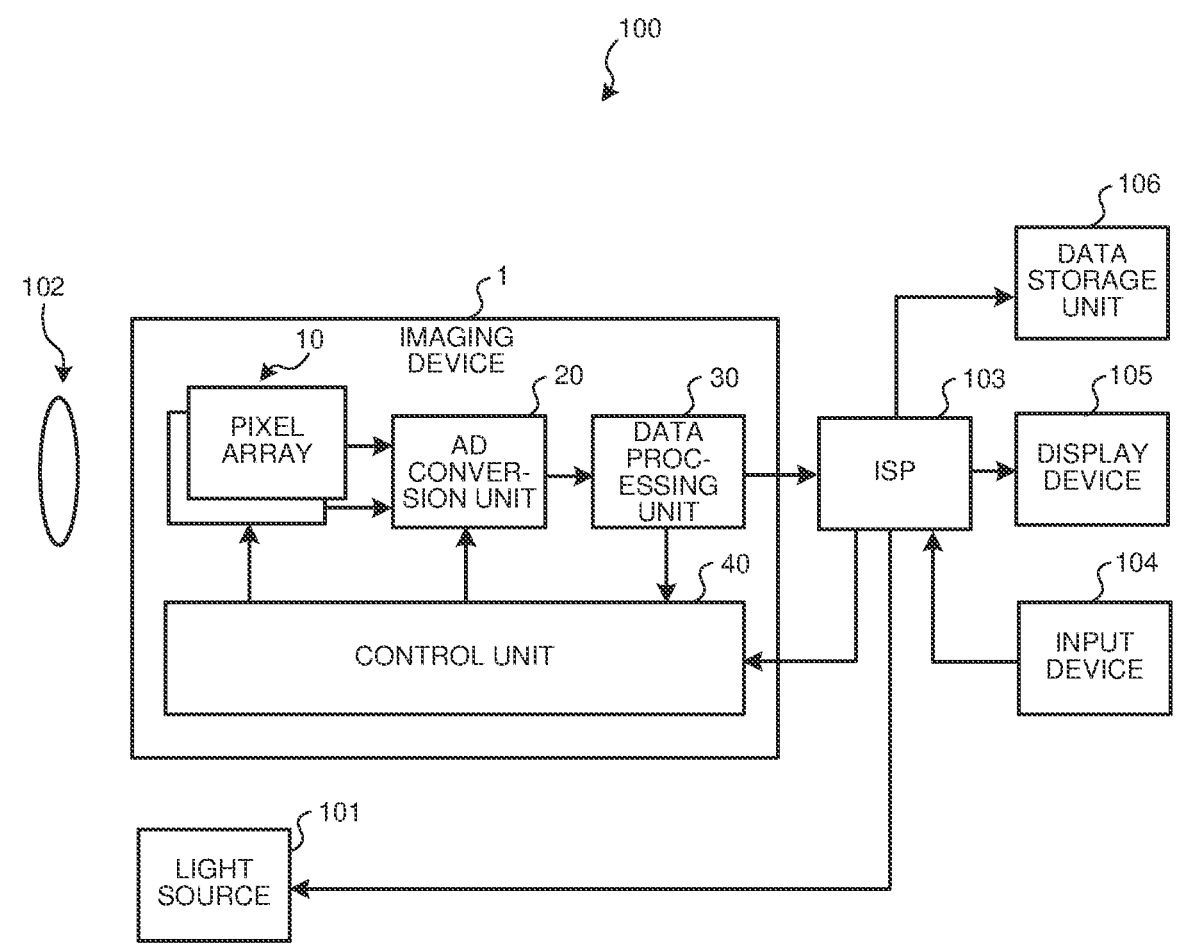
FIG. 1 is an explanatory diagram illustrating a configuration example of a ranging system according to the present disclosure.

Hereinafter, embodiments of the present disclosure will be described in detail with reference to the drawings. Note that, in the following embodiments, the same parts are denoted by the same reference numerals so that redundant description can be omitted.

1. Configuration Example of a Ranging System

FIG. 1 is an explanatory diagram illustrating a configuration example of a ranging system according to the present disclosure. A ranging system 100 illustrated in FIG. 1 is, for example, a system that implements d (direct) TOF sensor capturing an infrared light image (hereinafter may be referred to as a "distance image") of a subject irradiated with infrared light and measuring a distance to the subject from the distance image based on a time of flight (TOF). The ranging system 100 may be a system that implements i (indirect) ToF.

The ranging system 100 includes a light source 101, an imaging optical system 102, an imaging device 1, an image signal processor (ISP) 103, an input device 104, a display device 105, and a data storage unit 106.

The light source 101 is an infrared light laser that irradiates a subject of ranging with infrared light. The light source 101 is driven and controlled by the ISP 103, and emits infrared light while blinking at a predetermined high frequency at a high speed. The imaging optical system 102 includes a lens and the like that form an image of infrared light reflected by the subject on a light receiving unit of the imaging device 1.

The imaging device 1 is a device that captures the distance image that is an infrared light image of the subject and outputs image data of the distance image to the ISP 103. The imaging device 1 can capture not only the distance image but also a visible light image. When the imaging device 1 captures the visible light image, it outputs image data of the visible light image to the ISP 103 as necessary.

The ISP 103 drives and controls the light source 101, measures the distance to the subject from the image data of the distance image input from the imaging device 1 based on the time of flight of infrared light and phase shift information with respect to input light, and outputs the measurement results and the distance image to the display device 105 and the data storage unit 106. In addition, in a case where the image data of the visible light image is input from the imaging device 1, the ISP 103 outputs the image data of the visible light image to the display device 105 and the data storage unit 106 as necessary. Furthermore, the ISP 103 may also output colored three-dimensional information obtained by combining the distance information and RGB information to the display device 105 and the data storage unit 106 as necessary.

The display device 105 is, for example, a liquid crystal display, and displays the distance measurement results measured by the ISP 103, the infrared light image, or the visible light image. The data storage unit 106 is, for example, a memory, and stores the distance measurement results measured by the ISP 103, the image data of the infrared light image, or the image data of the visible light image.

The input device 104 receives a user operation for performing various settings of the ranging system 100 and a user operation for causing the ranging system 100 to perform ranging, and outputs a signal corresponding to the user operation to the ISP 103.

The imaging device 1 includes a pixel array 10, an analog to digital (AD) conversion unit 20, and a data processing unit 30. FIG. 1 illustrates some of the components of the imaging device 1. A specific configuration example of the imaging device 1 will be described later with reference to FIG. 2.

The pixel array 10 photoelectrically converts light incident from the imaging optical system 102 into a pixel signal of the distance image and a pixel signal of the visible light image, and outputs the pixel signals to the AD conversion unit 20. The AD conversion unit 20 performs AD conversion on the pixel signals of the distance image and the visible light image, and outputs the converted signals to the data processing unit 30. The data processing unit 30 performs various types of image processing and image analysis on the image data of the distance image and the visible light image, and outputs the image data after the image processing and image analysis to the ISP 103.

Here, in a case where the ranging system 100 is an iToF sensor, for example, a distance image (distance data) needs to be calculated from four pieces (times) of phase data. That is, four times of phase data are temporarily accumulated in the memory and then are calculated to create one distance image (distance data). In this case, it is necessary to install a memory unit (for example, a memory such as a static random access memory (SRAM)) that temporarily stores the phase data, separately from the data storage unit 106 (for example, flash memory).

Since the SRAM is a memory capable of writing and reading out information at a high speed, the SRAM is suitable for distance calculation processing that needs to be performed at a high speed. Such a memory only needs to be able to store information only when the power is on. In the case of the iToF sensor, the ranging system 100 uses a memory built in the ISP 103 for the temporary storage of the phase data.

In the ranging system 100, it is necessary to operate the light source 101 and the pixel array 10 capturing the distance image at a high frequency in order to improve the ranging accuracy, and thus power consumption is higher than that of a general visible light sensor. In response to this issue, the ranging system 100 reduces the power consumption by effectively using data of the visible light image in the imaging device 1.

Specifically, the imaging device 1 first captures a visible light image having relatively low power consumption required for imaging, and does not capture a distance image until a moving object is detected from the visible light image. Then, when the imaging device 1 detects the moving object in the visible light image, the imaging device 1 causes the light source 101 to emit light, and captures a distance image requiring relatively high power consumption for imaging to perform ranging. This allows the ranging system 100 to appropriately reduce the power consumption. Next, a configuration example of the imaging device 1 will be described.

2. Configuration Example of the Imaging Device

Figure 2:
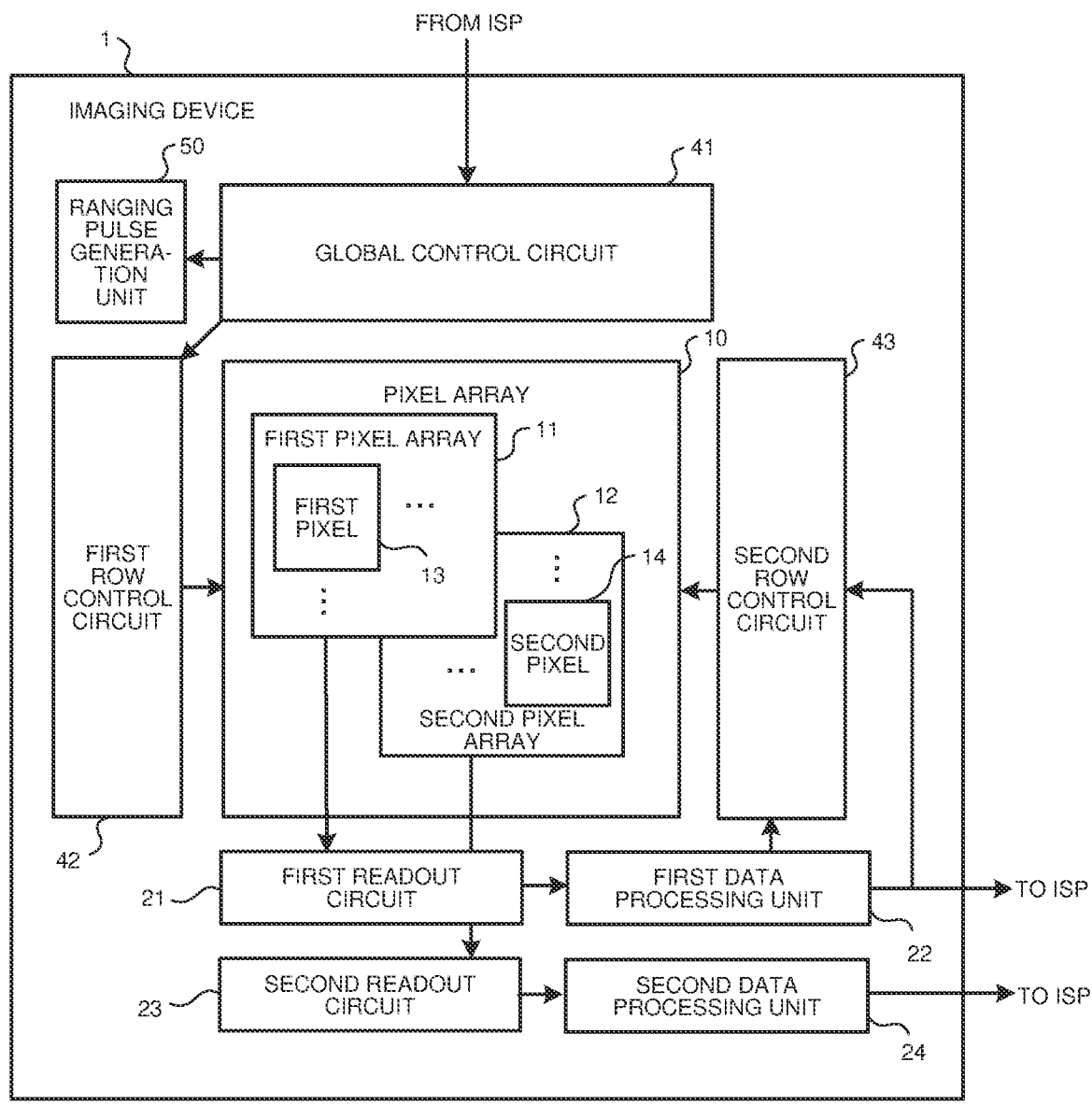
FIG. 2 is an explanatory diagram illustrating a configuration example of an imaging device according to the present disclosure.

FIG. 2 is an explanatory diagram illustrating a configuration example of the imaging device according to the present disclosure. As illustrated in FIG. 2, the imaging device 1 includes the pixel array 10, a global control circuit 41, a first row control circuit 42, a second row control circuit 43, a first readout circuit 21, a first data processing unit 22, a second readout circuit 23, and a second data processing unit 24. The global control circuit 41, the first row control circuit 42, and the second row control circuit 43 are included in a control unit 40 illustrated in FIG. 1.

The pixel array 10 includes a first pixel array 11 and a second pixel array 12. In the first pixel array 11, a plurality of first light receiving pixels (hereinafter referred to as a "first pixel") 13 corresponding to each pixel of a visible light image are arrayed two-dimensionally (in a matrix). In the second pixel array 12, a plurality of second light receiving pixels (hereinafter referred to as a "second pixel") 14 corresponding to each pixel of an infrared light image are arrayed two-dimensionally (in a matrix).

The first pixel 13 photoelectrically converts light in a first wavelength region including the visible light region into a signal charge corresponding to the amount of received light. Here, the first pixel 13 photoelectrically converts red light, green light, and blue light. The second pixel 14 photoelectrically converts light in a second wavelength region including the infrared light region. Here, the second pixel 14 photoelectrically converts the infrared light into a signal charge corresponding to the amount of received light.

The first pixel array 11 is stacked on the second pixel array 12. The first pixel array 11 photoelectrically converts incident visible light to capture a visible light image. The second pixel array 12 photoelectrically converts the infrared light transmitted through the first pixel array and captures an infrared light image. Thus, the imaging device 1 can capture the visible light image and the infrared light image using one pixel array 10.

The global control circuit 41 controls the first row control circuit 42 and a ranging pulse generation unit 50 based on the control signal from the ISP 103. The first row control circuit 42 drives and controls the first pixel array 11 to capture a visible light image. The first pixel array 11 photoelectrically converts visible light into a signal charge and accumulates the signal charge. The first readout circuit 21 reads out a signal corresponding to a signal charge from the first pixel array 11 and outputs the signal to the first data processing unit 22.

The first data processing unit 22 performs AD conversion on the signal input from the first readout circuit 21 to acquire image data of the visible light image, and performs predetermined image processing and image analysis on the image data. The first data processing unit 22 outputs the image data after the image processing and image analysis to the ISP 103 as necessary.

In addition, the first data processing unit 22 outputs the results of the image analysis to the second row control circuit 43 to operate the second row control circuit 43. Here, the first data processing unit 22 determines, for example, whether the subject in the visible light image is moving or not as the image analysis, and operates the second row control circuit 43 only in a case where the subject is moving.

That is, the first data processing unit 22 detects the first pixel 13 having a change from the image data captured by the first pixel array 11. Here, the first pixel 13 having the change is, for example, the first pixel 13 in which a difference between the signal charge amount accumulated in image data of the previous frame and the signal charge amount accumulated in image data of the current frame exceeds a threshold.

Then, the second row control circuit 43 starts driving the second pixel array 12 in a case where the first pixel 13 having the change is detected by the first data processing unit 22. Thus, the imaging device 1 can appropriately reduce the power consumption required to drive the second pixel array 12.

In addition, the first data processing unit 22 may be configured to control the second readout circuit 23 so as to read out a signal only from the second pixel 14 corresponding to the first pixel 13 having a change. Thus, the imaging device 1 can also reduce the power consumption of the second readout circuit 23.

Furthermore, the first data processing unit 22 may also cause the second row control circuit 43 to drive only the second pixel 14 corresponding to the first pixel 13 having a change in the first pixel array 11. Thus, the imaging device 1 can further reduce the power consumption required to drive the second pixel array 12.

The first data processing unit 22 may also set a threshold for the amount of change in the first pixel array 11 instead of using a binary value of whether the subject is moving or not, and cause the second row control circuit 43 to drive only the second pixel corresponding to the first pixel 13 in which the amount of change due to the movement of the subject exceeds the threshold. Thus, the imaging device 1 can minimize the number of the second pixels 14 to be driven.

In addition, the first data processing unit 22 may be configured to change the operation frequency of the second row control circuit 43 according to the change in the first pixel array 11. For example, when the change (moving speed of the subject) in the first pixel array 11 is great, the first data processing unit 22 increases the operation frequency of the second row control circuit 43. Thus, the imaging device 1 can capture a clear image of the subject having a high moving speed using the second pixel array.

The second row control circuit 43 drives and controls the second pixel array 12 to capture an infrared light image in a case where the first data processing unit 22 determines that the subject is moving. The second pixel array 12 photoelectrically converts infrared light into a signal charge and accumulates the signal charge. The second readout circuit 23 reads out a signal corresponding to a signal charge from the second pixel array 12 and outputs the signal to the second data processing unit 24.

The second data processing unit 24 performs AD conversion on the signal input from the second readout circuit 23 to acquire image data of a distance image that is an infrared light image, performs predetermined image processing on the image data, and outputs the image data to the ISP 103.

The range of the second pixels 14 to be driven in the second pixel array 12 is not only determined by the first data processing unit 22. For example, the range of the second pixels 14 to be driven may be determined by the control unit 40 (second row control circuit 43), may be determined by a dedicated determination circuit, or may be determined by the ISP 103.

In this case, the second row control circuit 43, the determination circuit, or the ISP 103 acquires the image data of the visible light image from the first data processing unit 22, and detects the first pixel 13 having a change from the image data. Then, the second row control circuit 43, the determination circuit, or the ISP 103 determines the range of the second pixels 14 arranged at a position overlapping the detected first pixel 13 as the range of the second pixels 14 to be driven.

In a case where the ranging system 100 is an iToF sensor, since the distance cannot be calculated from one (one time of) distance image, it is also possible, for example, to store the distance image in the memory inside the ISP 103 and calculate the distance to the subject from a plurality of distance images stored inside the ISP 103, as described above.

3. Cross-Sectional Structure of Pixel Array

Figure 3:
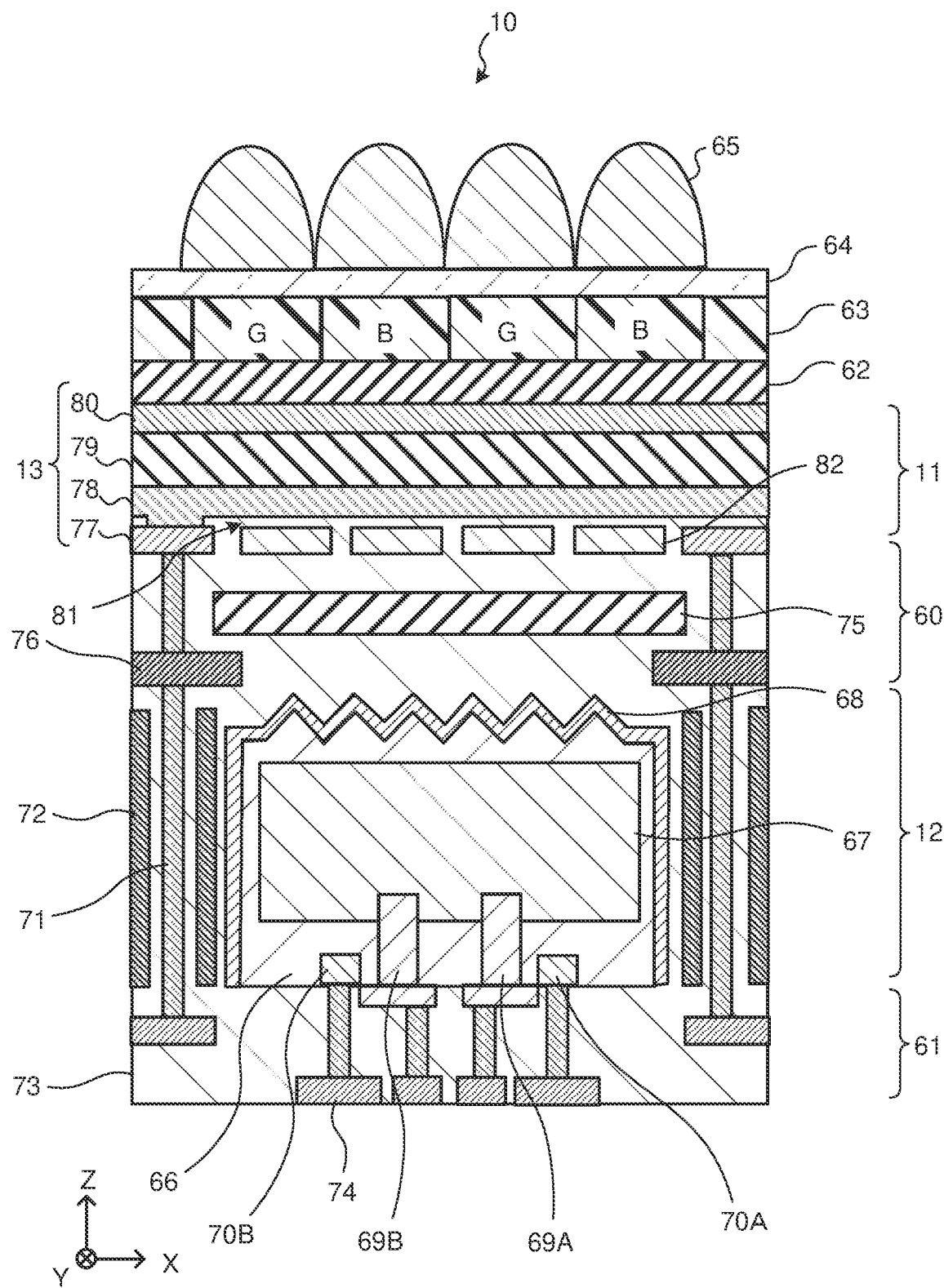
FIG. 3 is an explanatory cross-sectional view of a pixel array according to the present disclosure.

Next, a cross-sectional structure of the pixel array according to the present disclosure will be described with reference to FIG. 3. FIG. 3 is an explanatory cross-sectional view of a pixel array according to the present disclosure. FIG. 3 schematically illustrates a cross section of the pixel array 10 in a portion corresponding to one second pixel 14. Note that, here, the positive direction of the Z axis in the orthogonal coordinate system illustrated in FIG. 3 will be referred to as a "upper" side for convenience, and the negative direction of the Z axis will be referred to as a "lower" side for convenience.

As illustrated in FIG. 2, the pixel array 10 includes a so-called vertical spectroscopic imaging element having a structure in which the second pixel 14 and the first pixel 13 are stacked in the Z-axis direction that is the thickness direction. The pixel array 10 includes an intermediate layer 60 provided between the second pixel 14 and the first pixel 13, and a multilayer wiring layer 61 provided on a side opposite to the first pixel 13 as viewed from the second pixel 14.

Furthermore, in the pixel array 10, a sealing film 62, a color filter 63, a planarizing film 64, and an on-chip lens 65 are stacked along the positive direction of the Z axis in order from a position close to the first pixel 13 on the side opposite to the intermediate layer 60 as viewed from the first pixel 13.

The first pixel 13 is an indirect TOF (hereinafter described as "iTOF") sensor that acquires a distance image (distance information) based on TOF. The first pixel 13 includes a semiconductor substrate 66, a photoelectric conversion region 67, a fixed charge layer 68, a pair of gate electrodes 69A and 69B, floating diffusions 70A and 70B, and a through electrode 71.

The semiconductor substrate 66 is, for example, an n-type silicon substrate, and has a P-well in a predetermined region inside. The lower surface of the semiconductor substrate 66 faces the multilayer wiring layer 61. The upper surface of the semiconductor substrate 66 faces the intermediate layer 60, and has a fine uneven structure. With this configuration, the upper surface of the semiconductor substrate 66 produces the effect of appropriately scattering incident infrared light to increase the optical path length. Note that the fine uneven structure may also be formed on the lower surface of the semiconductor substrate 66.

The photoelectric conversion region 67 is a photoelectric conversion element including a positive intirinsic negative (PIN) type photodiode. The photoelectric conversion region 67 mainly receives light having a wavelength in the infrared region (infrared light) from light incident on the pixel array 10, and photoelectrically converts the received light into a signal charge corresponding to the amount of received light and accumulates the signal charge.

The fixed charge layer 68 is provided so as to cover the upper surface and the side surface of the semiconductor substrate 66. The fixed charge layer 68 contains a negative fixed charge that suppresses the generation of a dark current due to an interface state of the upper surface of the semiconductor substrate 66 serving as a light receiving surface.

The fixed charge layer 68 forms a hole accumulation layer in the vicinity of the upper surface of the semiconductor substrate 66, and the hole accumulation layer suppresses the generation of electrons from the upper surface of the semiconductor substrate 66. The fixed charge layer 68 also extends between an inter-pixel region light-shielding wall 72 and the photoelectric conversion region 67.

The gate electrodes 69A and 69B extend from the lower surface of the semiconductor substrate 66 to a position reaching the photoelectric conversion region 67. When a predetermined voltage is applied, the gate electrodes 69A and 69B transfer the signal charge accumulated in the photoelectric conversion region 67 to the floating diffusions 70A and 70B.

The floating diffusions 70A and 70B are floating diffusion regions that temporarily hold the signal charge transferred from the photoelectric conversion region 67. The signal charge held in the floating diffusions 70A and 70B are read out as the pixel signal by the second readout circuit 23 (see FIG. 2).

In the multilayer wiring layer 61, a wiring 74 is provided inside an insulating layer 73. The insulating layer 73 is formed of, for example, silicon oxide or the like. The wiring 74 is formed of metal such as copper or gold, for example. In addition, the first readout circuit 21, the second readout circuit 23 (see FIG. 2), and the like are also provided inside the insulating layer 73.

The intermediate layer 60 includes an optical filter 75 and an inter-pixel region light-shielding film 76 that are embedded in the insulating layer 73. The optical filter 75 is formed of, for example, an organic material, and selectively transmits mainly light having a frequency in the infrared light region. The inter-pixel region light-shielding film 76 reduces color mixing between adjacent pixels.

The first pixel 13 includes a first electrode 77, a semiconductor layer 78, a photoelectric conversion layer 79, and a second electrode 80 stacked in order from a position close to the photoelectric conversion region 67. Furthermore, the first pixel 13 includes a charge accumulation electrode 82 provided below the semiconductor layer 78 so as to face the semiconductor layer 78 via an insulating film 81.

The charge accumulation electrode 82 and the first electrode 77 are separated from each other, and are provided, for example, in the same layer. The first electrode 77 is connected to, for example, the upper end of the through electrode 71. The second electrode 80, and the charge accumulation electrode 82 are formed of a light transmissive conductive film, such as indium tin oxide (ITO) or indium zinc oxide (IZO).

The photoelectric conversion layer 79 converts light energy into electric energy, and contains, for example, two or more kinds of organic materials functioning as a p-type semiconductor and an n-type semiconductor. The p-type semiconductor functions as an electron donor (donor). The n-type semiconductor functions as an electron acceptor (acceptor). The photoelectric conversion layer 79 has a bulk heterojunction structure. The bulk heterojunction structure is a p/n junction surface formed by mixing the p-type semiconductor and the n-type semiconductor. The photoelectric conversion layer 79 separates incident light into electrons and holes at the p/n junction surface.

The color filter 63 that transmits visible light (red light (R), green light (G), and blue light (B)) is provided in the layer above the photoelectric conversion layer 79. The photoelectric conversion layer 79 photoelectrically converts the incident visible light.

The charge accumulation electrode 82 forms a capacitor together with the insulating film 81 and the semiconductor layer 78, and accumulates the signal charge generated in the photoelectric conversion layer 79 in a region of the semiconductor layer 78 facing the charge accumulation electrode 82 via the insulating film 81. In the present embodiment, the charge accumulation electrode 82 is provided at a position corresponding to each of the color filters 63 and the on-chip lenses 65.

In the first pixel 13, light incident from the second electrode 80 side is absorbed by the photoelectric conversion layer 79. Excitons (electron-hole pairs) generated by the light absorption move to an interface between an electron donor and an electron acceptor constituting the photoelectric conversion layer 79, and are separated into electrons and holes. The electrons and holes generated here move to and accumulated in the second electrode 80 or the semiconductor layer 78 due to an internal electric field formed by a carrier concentration difference or a potential difference between the first electrode 77 and the second electrode 80.

For example, the first electrode 77 is set to a positive potential, and the second electrode 80 is set to a negative potential. In this case, the holes generated in the photoelectric conversion layer 79 move to the second electrode 80 side. The electrons generated in the photoelectric conversion layer 79 are attracted to the charge accumulation electrode 82 and accumulated in the region of the semiconductor layer 78 corresponding to the charge accumulation electrode 82 via the insulating film 81.

The electrons accumulated in the region of the semiconductor layer 78 corresponding to the charge accumulation electrode 82 via the insulating film 81 are read out as follows. For example, a potential V1 is applied to the first electrode 77, and a potential V2 is applied to the charge accumulation electrode 82. At this time, the potential V1 is set to be higher than the potential V2. As a result, the electrons accumulated in the region of the semiconductor layer 78 corresponding to the charge accumulation electrode 82 via the insulating film 81 are transferred to the first electrode 77 and read out.

As described above, the following effects can be obtained by providing the semiconductor layer 78 below the photoelectric conversion layer 79, and accumulating charges (for example, electrons) in the region of the semiconductor layer 78 corresponding to the charge accumulation electrode 82 via the insulating film 81. As compared with a case where charges (for example, electrons) are accumulated in the photoelectric conversion layer 79 without providing the semiconductor layer 78, recombination of holes and electrons during charge accumulation is prevented, thus making it possible to increase the transfer efficiency of the accumulated charges (for example, electrons) to the first electrode 77. Here, the case where electrons are read out has been described, but holes may be read out. In the case where holes are read out, the relationship between the levels of the potentials V1, V2, and V3 in the above description is reversed.

4. First Readout Circuit

Figure 4:
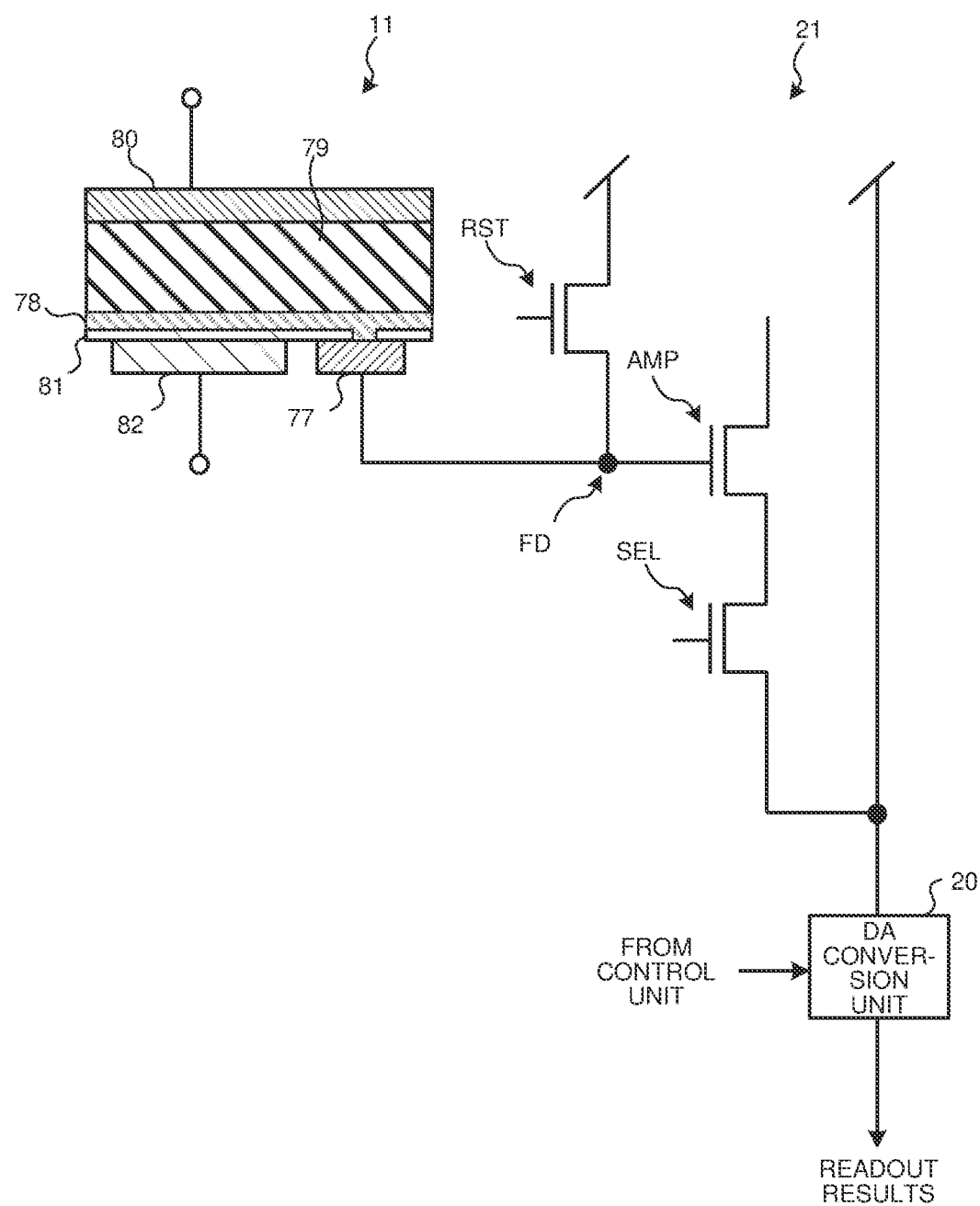
FIG. 4 is a circuit diagram illustrating an example of a first readout circuit according to the present disclosure.

FIG. 4 is a circuit diagram illustrating an example of the first readout circuit according to the present disclosure. The first readout circuit 21 includes, for example, a floating diffusion FD, a reset transistor RST, an amplification transistor AMP, and a selection transistor SEL. The floating diffusion FD is connected between the first electrode 77 and the amplification transistor AMP. The floating diffusion FD converts the signal charge transferred by the first electrode 77 into a voltage signal and outputs the voltage signal to the amplification transistor AMP.

The reset transistor RST is connected between the floating diffusion FD and a power supply. When a drive signal is applied to the gate electrode of the reset transistor RST and the reset transistor RST is turned on, the potential of the floating diffusion FD is reset to the power supply level. The amplification transistor AMP includes a gate electrode connected to the floating diffusion FD and a drain electrode connected to a power supply. The source electrode of the amplification transistor AMP is connected to a vertical signal line via the selection transistor SEL.

The selection transistor SEL is connected between the source electrode of the amplification transistor AMP and the vertical signal line. When a drive signal is applied to the gate electrode of the selection transistor SEL and the selection transistor SEL is turned on, a pixel signal output from the amplification transistor AMP is output to the AD conversion unit 20 via the SEL and the vertical signal line. The AD conversion unit 20 performs AD conversion on the pixel signal based on the control signal input from the control unit 40, and outputs the pixel signal to the data processing unit 30.

5. Arrangement Example of the Pixels

Figure 5:
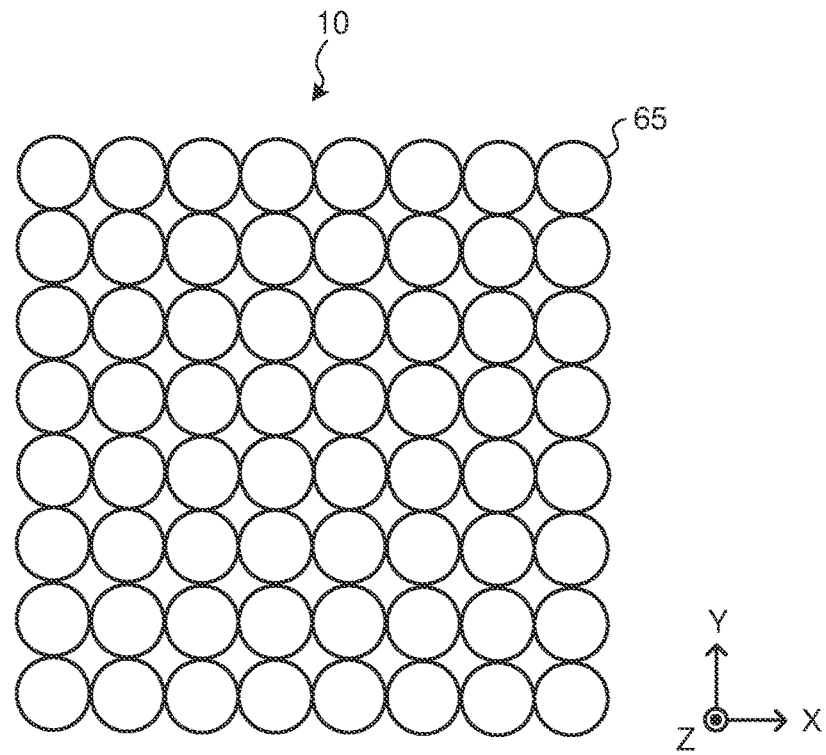
FIG. 5 is an explanatory diagram illustrating an arrangement example of pixels according to the present disclosure in plan view.
Figure 6:
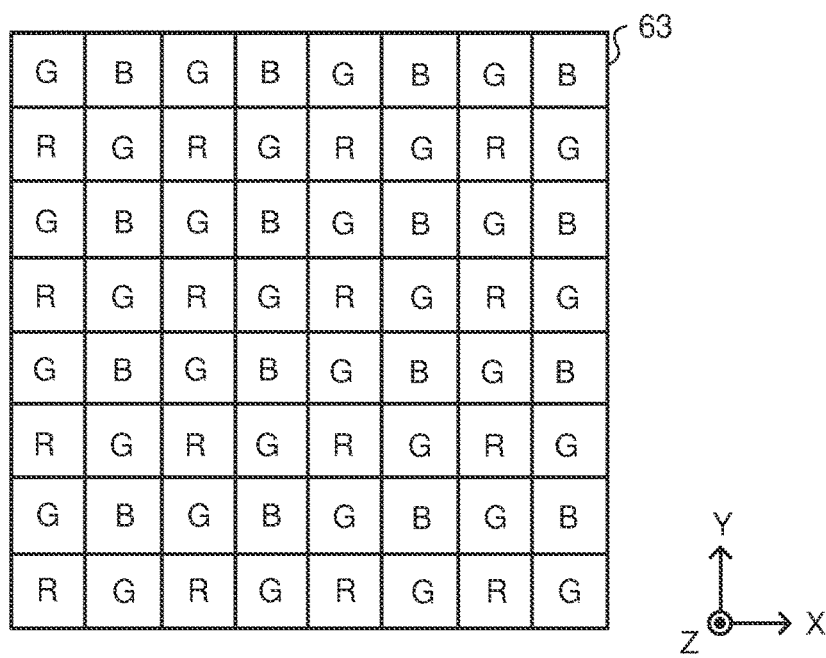
FIG. 6 is an explanatory diagram illustrating an arrangement example of pixels according to the present disclosure in plan view.

Next, an arrangement example of the pixels according to the present disclosure in plan view will be described with reference to FIGS. 5 to 8. FIGS. 5 to 8 are explanatory diagrams illustrating the arrangement example of the pixels according to the present disclosure in plan view. As illustrated in FIG. 5, a plurality of on-chip lenses 65 are arranged two-dimensionally (in a matrix) in the uppermost layer of the pixel array 10. In addition, in the pixel array 10, as illustrated in FIG. 6, a plurality of color filters 63 are arranged two-dimensionally (in a matrix) in a layer below the layer in which the on-chip lenses 65 are arranged.

The color filter 63 includes a filter R that selectively transmits red light, a filter G that selectively transmits green light, and a filter G that selectively transmits blue light. Each color filter 63 (one filter R, G, or B) is provided at a position corresponding to one on-chip lens 65.

The corresponding position here is, for example, a position where the objects overlap each other in the Z-axis direction. Each of the filters R, G, and B is arranged according to a color arrangement method called a Bayer array, for example. Note that the array of the filters R, G, and B is not limited to the Bayer array.

Figure 7:
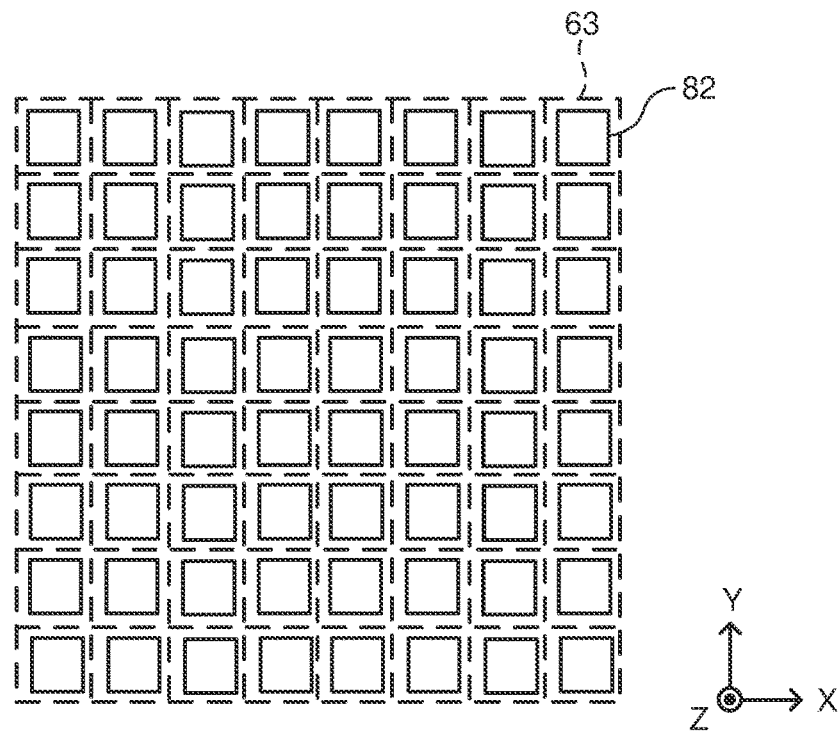
FIG. 7 is an explanatory diagram illustrating an arrangement example of pixels according to the present disclosure in plan view.

In addition, in the pixel array 10, as illustrated in FIG. 7, a plurality of charge accumulation electrodes 82 of the first pixel array 11 are arranged two-dimensionally (in a matrix) in a layer below the layer in which the color filters 63 are arranged. In FIG. 7, each color filter 63 is indicated by a broken line to clarify the positional relationship between each charge accumulation electrode 82 and each color filter 63. Each charge accumulation electrodes 82 is provided at a position corresponding to one filter R, G, or B. The corresponding position here is, for example, a position where the objects overlap each other in the Z-axis direction.

Figure 8:
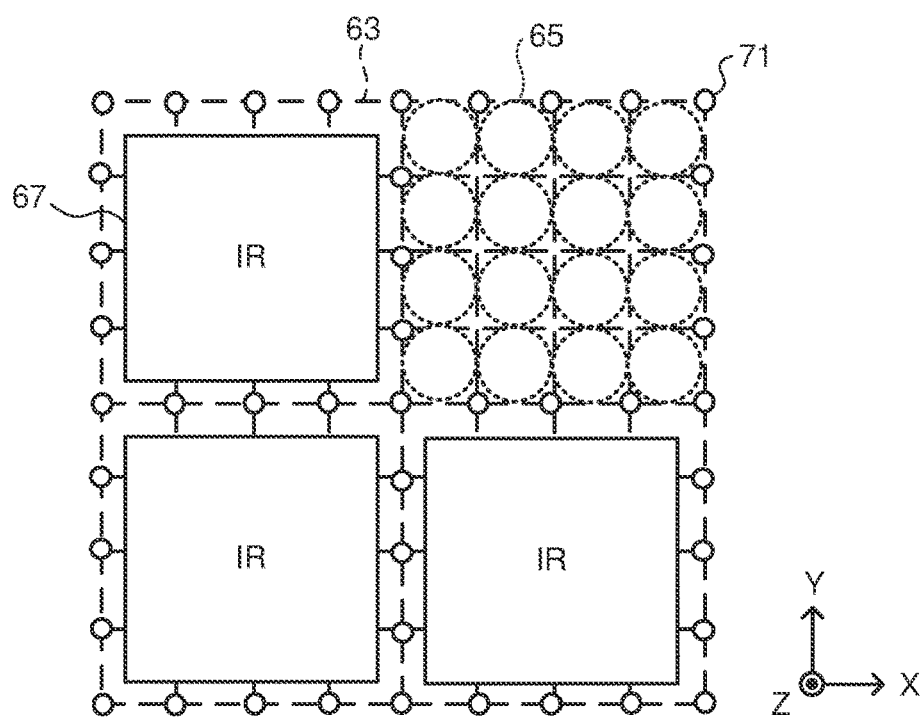
FIG. 8 is an explanatory diagram illustrating an arrangement example of pixels according to the present disclosure in plan view.

Furthermore, in the pixel array 10, as illustrated in FIG. 8, a plurality of photoelectric conversion regions 67 of the second pixel array 12 are arranged two-dimensionally (in a matrix) in a layer below a layer in which the charge accumulation electrodes 82 of the first pixel array 11 are arranged. A plurality of through electrodes 71 are provided around each photoelectric conversion region 67.

In FIG. 8, each color filter 63 and on-chip lens 65 are indicated by a broken line and a dotted line, respectively, to clarify the positional relationship between each photoelectric conversion region 67, each on-chip lens 65, and each color filter 63. Each photoelectric conversion region 67 is provided at a position corresponding to 16 on-chip lenses 65 and 16 color filters 63 that are arrayed in a matrix of 4×4 in the vertical and horizontal directions. The corresponding position here is, for example, a position where the objects overlap each other in the Z-axis direction.

Note that, here, one photoelectric conversion region 67 is provided for the 16 on-chip lenses 65 and the 16 color filters 63, but this is an example. For example, in the pixel array 10, one photoelectric conversion region 67 may be provided for four on-chip lenses 65 and 16 color filters 63, and one photoelectric conversion region 67 may be provided for one on-chip lens 65 and 16 color filters 63.

6. Operation Example of the Imaging Device

Figure 9:
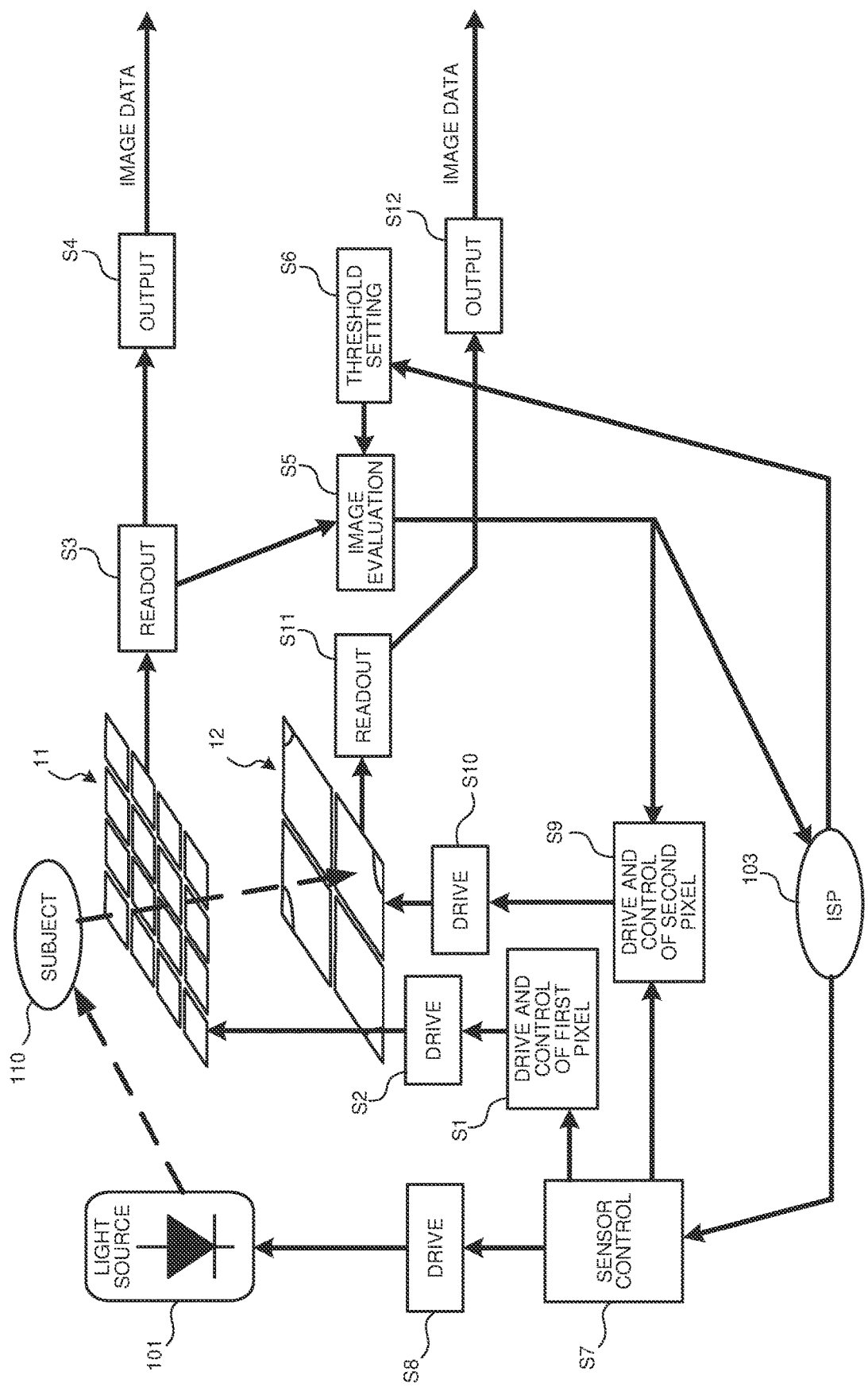
FIG. 9 is an explanatory diagram illustrating an operation example of the imaging device according to the present disclosure.

Next, an operation example of the imaging device according to the present disclosure will be described with reference to FIG. 9. FIG. 9 is an explanatory diagram illustrating the operation example of the imaging device according to the present disclosure. As illustrated in FIG. 9, the imaging device 1 first causes the control unit 40 to perform first pixel control (step S1) and drive the first pixel array 11 (step S2). Thus, the first pixel array 11 causes the first pixel 13 to photoelectrically convert incident light into a signal charge and accumulate the signal charge.

Then, the imaging device 1 causes the first readout circuit 21 to read out a pixel signal corresponding to the signal charge from the first pixel array 11 (step S3), and causes the first data processing unit 22 to perform AD conversion on the pixel signal. The first data processing unit 22 outputs the pixel signal after AD conversion (image data of a visible light image) as necessary (step S4).

In addition, the imaging device 1 causes the first data processing unit 22 to evaluate the visible light image (step S5). At this time, the first data processing unit 22 detects the first pixel 13 having a change in the visible image. For example, the first data processing unit 22 detects the first pixel 13 in which a difference between the signal charge amount accumulated in the image data of the previous frame and the signal charge amount accumulated in the image data of the current frame exceeds a threshold. The threshold value is set by the ISP 103, for example (step S6). The first data processing unit 22 outputs detection results of the first pixel 13 having the change to the second row control circuit 43 and the ISP 103.

When the first pixel 13 having the change is detected, the ISP 103 performs sensor control (step S7) and drives the light source 101 (step S8). Then, the light source 101 emits light while blinking at a high frequency, and irradiates a subject 110 with infrared light. Thus, since the ranging system 100 causes the light source 101 to emit light only after the first pixel 13 having the change is detected, the power consumption of the light source 101 can be reduced as compared with a case where the light source 101 constantly emits light.

Alternatively, the ISP 103 may cause the light source 101 to emit light with relatively low luminance before the first pixel 13 having the change is detected, and, when the first pixel 13 having the change is detected, increase the light emission intensity of the light source 101 to emit light with higher luminance.

Meanwhile, the imaging device 1 causes the second row control circuit 43 to perform second pixel control (step S9) and drive the second pixel array 12 (step S10). Thus, the second pixel array 12 causes the second pixel 14 to photoelectrically convert infrared light incident through the first pixel array 11 into a signal charge and accumulate the signal charge. Thus, since the second row control circuit 43 drives the second pixel array 12 only after the first pixel 13 having a change is detected, the power consumption of the second pixel array 12 can be reduced as compared with a case where the second pixel array 12 is constantly driven.

At this time, the second row control circuit 43 may drive all the second pixels 14, but may also selectively drive the second pixel 14 corresponding to the first pixel 13 having a change. The second row control circuit 43 can reduce the power consumption by selectively driving the second pixel 14 corresponding to the first pixel 13 having the change.

Alternatively, the second row control circuit 43 may also set the drive frequency of the second pixel 14 corresponding to the first pixel 13 to be higher than usual in a case where the change amount of the first pixel 13 having the change is great and, for example, the change amount exceeds a threshold value.

Then, the imaging device 1 causes the second readout circuit 23 to read out a pixel signal corresponding to the signal charge from the second pixel array 12 (step S11), and causes the second data processing unit 24 to perform AD conversion on the pixel signal and output the pixel signal after AD conversion (image data of an infrared light image) (step S12).

The second data processing unit 24 may read out the pixel signal from all the second pixels 14, perform AD conversion only on the pixel signal of the second pixel 14 corresponding to the first pixel 13 having a change, and output the pixel signal after AD conversion (the image data of the infrared light image). Thus, the imaging device 1 can also reduce the power consumption required for AD conversion.

Alternatively, the second data processing unit 24 may read out the pixel signal only from the second pixel 14 corresponding to the first pixel 13 having a change, perform AD conversion on the read pixel signal, and output the pixel signal after AD conversion (the image data of the infrared light image). Thus, the imaging device 1 can also reduce the power consumption required to read out the pixel signal.

As described above, the imaging device 1 effectively uses information of the visible light image, and drives and controls the second pixel array 12 based on the signal photoelectrically converted by the first pixel array 11, so that the power consumption of the light source 101 and the imaging device 1 is reduced.

7. Processing Executed by the Control Unit

Figure 10:
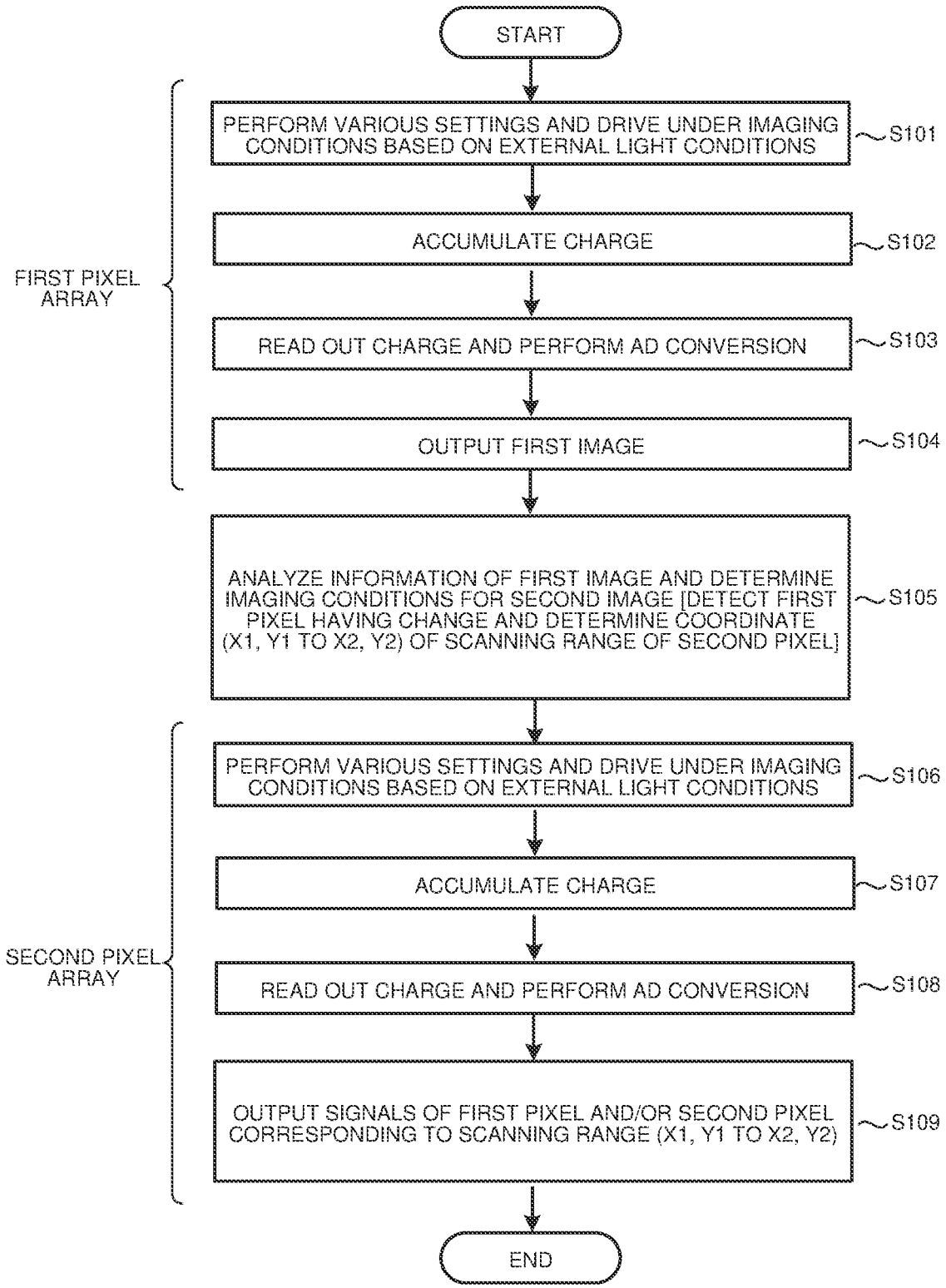
FIG. 10 is a flowchart illustrating an example of processing executed by the imaging device according to the present disclosure.

Next, an example of processing executed by the imaging device according to the present disclosure will be described with reference to FIG. 10. FIG. 10 is a flowchart illustrating the example of processing executed by the imaging device according to the present disclosure. As illustrated in FIG. 10, the imaging device 1 performs various settings and drives the first pixel array 11 under imaging conditions based on external light conditions to capture a visible light image serving as a first image (step S101).

Then, the imaging device 1 causes the first pixel array 11 to photoelectrically convert the visible light and accumulate a signal charge (step S102). Subsequently, the imaging device 1 reads out the signal charge (signal) from the first pixel array 11 and performs AD conversion on the signal (step S103). Subsequently, the imaging device 1 outputs the first image that is a visible light image. At this time, the imaging device 1 may also output the first image by thinning out the first pixel 13 from the first pixel array 11.

Then, the imaging device 1 analyzes information of the first image and determines imaging conditions for a second image that is an infrared light image (step S105). Specifically, the imaging device 1 detects the first pixel 13 having a change, and determines a coordinate (X1, Y1 to X2, Y2) of a scanning range of the second pixel 14. The scanning range determined at this time may be a single pixel, a set region of a plurality of pixels, or a combination thereof.

In addition, in a case where the first data processing unit 22 has, for example, a face authentication function, the imaging device 1 may cause the first data processing unit 22 to detect the position of the face of the subject in the visible light image and determine only a portion important for face authentication as the scanning range. Furthermore, since the position of the subject may change with the lapse of time, the imaging device 1 may appropriately track the position of the subject in the visible light image or set the scanning range to be larger.

Subsequently, the imaging device 1 performs various settings, and drives the second pixel array 12 under imaging conditions based on external light conditions to capture an infrared light image (step S106). Then, the imaging device 1 causes the second pixel array 12 to photoelectrically convert the infrared light and accumulate a signal charge (step S107).

Then, the imaging device 1 reads out the signal charge (signal) from the second pixel 14 and performs AD conversion on the signal (step S108). Subsequently, the imaging device 1 outputs the signals of the first pixel 13 and/or the second pixel 14 corresponding to the scanning range (X1, Y1 to X2, Y2) to the ISP 103 (step S109), and ends the processing.

8. Modification of Processing Executed by the Control Unit

Figure 11:
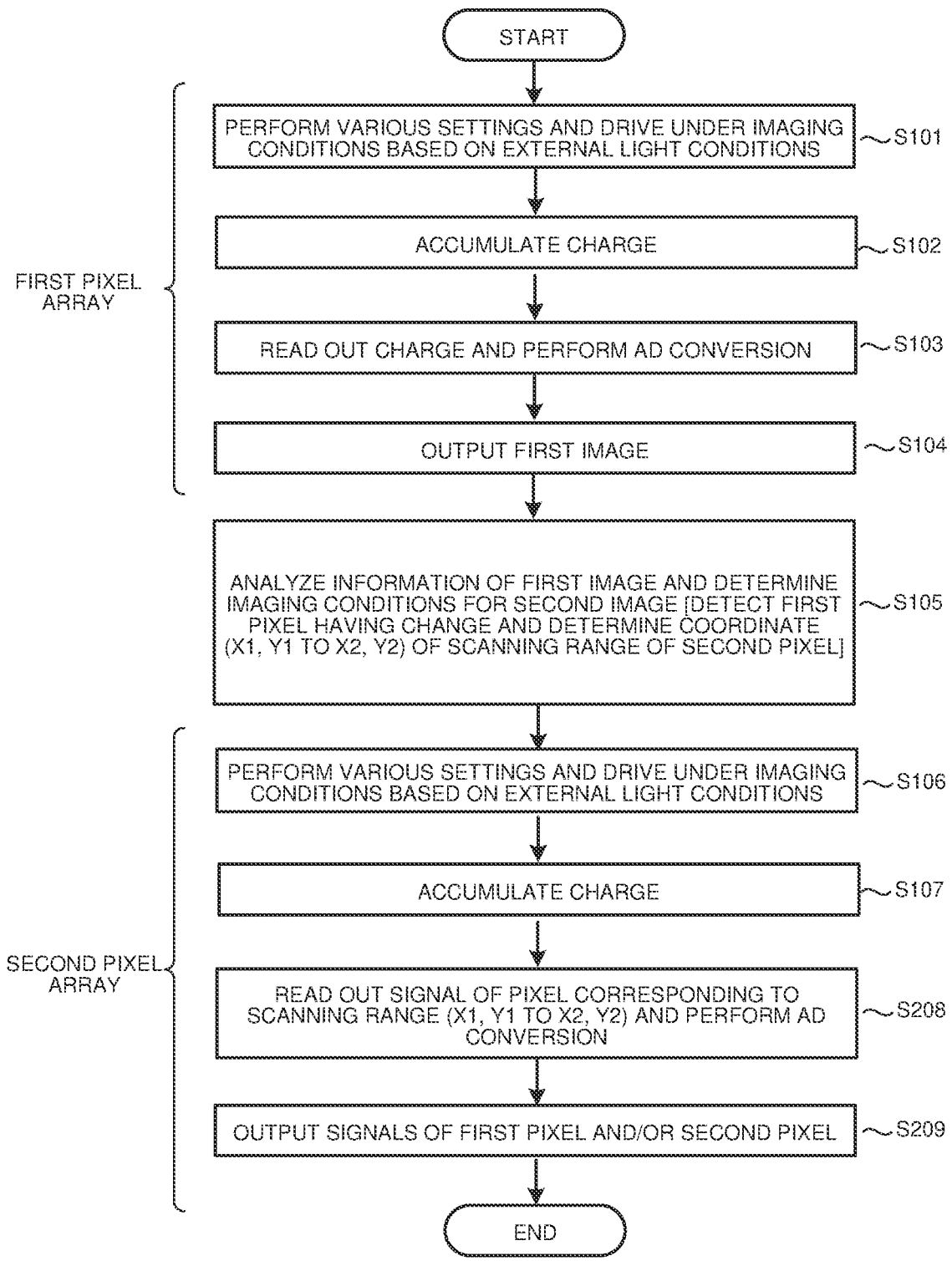
FIG. 11 is a flowchart illustrating a modification of processing executed by the imaging device according to the present disclosure.

Next, a modification of processing executed by the imaging device according to the present disclosure will be described with reference to FIG. 11. FIG. 11 is a flowchart illustrating the modification of processing executed by the imaging device according to the present disclosure. As illustrated in FIG. 11, in the processing according to the modification, the processing of steps S208 and S209 is different from the processing of steps S108 and S109 illustrated in FIG. 10. The processing of steps S101 to S107 illustrated in FIG. 11 is the same as the processing of S101 to S107 illustrated in FIG. 10, and thus redundant description is omitted here.

As illustrated in FIG. 11, the imaging device 1 causes the second pixel 14 to accumulate a signal charge (signal) (step S107), then reads out a signal of the second pixel 14 corresponding to the scanning range (X1, Y1 to X2, Y2) determined in step S105, and performs AD conversion on the read signal (step S208). Then, the imaging device 1 outputs the signals of the first pixel 13 and/or the second pixel 14 to the ISP 103 (step S209), and ends the processing.

9. Configuration Example of the Ranging System According to a Modification

Figure 12:
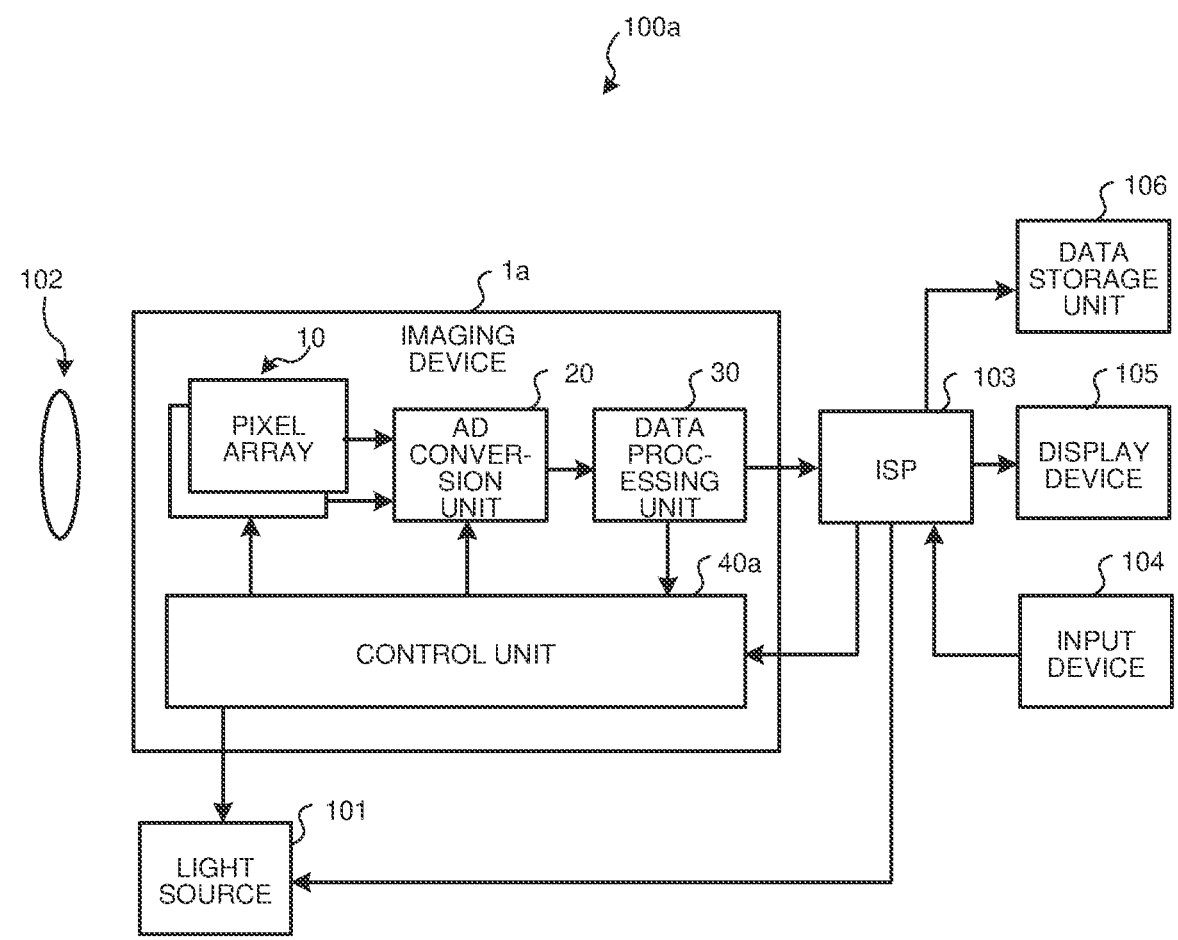
FIG. 12 is an explanatory diagram illustrating a configuration example of a ranging system according to a modification of the present disclosure.

Next, a ranging system according to a modification will be described. FIG. 12 is an explanatory diagram illustrating a configuration example of the ranging system according to the modification of the present disclosure.

As illustrated in FIG. 12, a ranging system 100a according to the modification is different from the ranging system 100 illustrated in FIG. 1 in that a control unit 40a drives and controls a light source 101, and other configurations are the same as those of the ranging system 100 illustrated in FIG. 1. Therefore, here, driving and controlling of the light source 101 by the control unit 40a will be described, and redundant description of other configurations will be omitted.

In a case where the results of image analysis by a first data processing unit 22 find that a subject in a visible light image moves vigorously at a moving speed exceeding the threshold, the control unit 40a controls a ranging pulse generation unit 50 to set the light emission intensity of the light source 101 to be higher than usual or set the operation frequency of the light source 101 to be higher than usual. In addition, the control unit 40a also adjusts the drive frequency of a second pixel array 12 in accordance with the change in the operation frequency of the light source 101.

Furthermore, for example, in a case where the results of the image analysis by the first data processing unit 22 find that the subject in the visible light image is a face and the face is closer to an imaging optical system 102 than a preset place, the control unit 40a sets the light emission intensity of the light source 101 to be lower than usual.

Thus, the control unit 40a can irradiate the subject with appropriate infrared light according to the moving speed of the subject and the distance to the subject. Therefore, the second pixel array 12 can capture an appropriate infrared light image for ranging.

10. Processing Executed by the Control Unit According to the Modification

Next, an example of processing executed by the imaging device according to the modification of the present disclosure will be described with reference to FIG. 13. FIG. 13 is a flowchart illustrating the example of the processing executed by the imaging device according to the modification of the present disclosure.

As illustrated in FIG. 13, in the processing executed by the imaging device according to the modification, the processing of steps S305 to S310 is different from the processing of steps S105 and 109 illustrated in FIG. 10. The processing of steps S101 to S104 illustrated in FIG. 13 is the same as the processing of steps S101 to S104 illustrated in FIG. 10, and thus redundant description is omitted here.

As illustrated in FIG. 13, an imaging device 1a causes a first pixel array 11 to accumulate a signal charge (signal) (step S104), then analyzes information of a first image, and determines imaging conditions for a second image serving as an infrared light image.

At this time, the imaging device 1a detects a first pixel 13 having a change, and determines a coordinate (X1, Y1 to X2, Y2) of the scanning range of a second pixel 14. Then, the imaging device 1a determines the light emission intensity and the light emission time (operation frequency) of the light source 101 (step S305). Subsequently, the imaging device 1a causes the light source 101 to emit light with the determined light emission intensity and light emission time (operation frequency) (step S306).

Then, the imaging device 1a opens the gate of the second pixel 14 at a timing corresponding to the determined light emission time (operation frequency) (step S307), closes the gate of the second pixel 14 (step S308), photoelectrically converts infrared light received by the second pixel 14, and accumulates a charge.

Then, the imaging device 1a reads out a signal of a pixel corresponding to the scanning range (X1, Y1 to X2, Y2) and performs AD conversion (step S309). Next, the imaging device 1a outputs the signals of the first pixel 13 and/or the second pixel 14 to the ISP 103 (step S310), and ends the processing.

11. Other Embodiments

The above-described embodiments are examples, and various modifications are possible. For example, the optical filter 75 illustrated in FIG. 3 may be omitted from the imaging device according to the present disclosure. In a case where the optical filter 75 is not provided, both the first pixel array 11 and the second pixel array 12 capture a visible light image. Here, for example, the light receiving sensitivity of the first pixel array 11 is reduced if the thickness of the photoelectric conversion layer 79 is set to be thinner than the thickness illustrated in FIG. 3.

By using such a property, the imaging device causes the first pixel array 11 to capture a first image having lower sensitivity and causes the second pixel array 12 to capture a second image having higher sensitivity than the first image, and outputs the first image and the second image to the ISP 103. Thus, the ISP 103 can generate a high dynamic range (HDR) image by synthesizing the first image and the second image in an HDR.

In the case of this configuration, it is desirable to provide one photoelectric conversion region 67 for one charge accumulation electrode 82. This allows the imaging device to capture the same number of the low sensitivity images as the high sensitivity images. In addition, adding a filter that transmits infrared light to the imaging optical system 102 allows the generation of an infrared light HDR image.

In the above-described embodiments, the case where the first pixel array 11 is stacked on the second pixel array 12 has been described; however, the first pixel array 11 and the second pixel array 12 may be provided on the same plane. Also in this case, the imaging device can perform the same control as the above-described control by the control units 40 and 40a, thereby appropriately reducing the power consumption by effectively using the information of the visible light image.

12. Effects

The imaging device 1 includes the semiconductor substrate 66, the first pixel array 11, the second pixel array 12, and the control unit 40. In the first pixel array 11, the first light receiving pixel 13 that is provided on the semiconductor substrate 66, has a stacked structure in which the first electrode 77, the photoelectric conversion layer 79, and the second electrode 80 are sequentially stacked, and photoelectrically converts light in the first wavelength region including the visible light region is two-dimensionally arrayed. In the second pixel array 12, the second light receiving pixel 14 that is provided at a position overlapping the first light receiving pixel 13 in the semiconductor substrate 66 in the thickness direction of the semiconductor substrate 66, and photoelectrically converts light in the second wavelength region including the infrared light region is two-dimensionally arrayed. The control unit 40 drives and controls the second pixel array 12 based on the signal photoelectrically converted by the first pixel array 11. Thus, the imaging device 1 can effectively use the information of the visible light image.

The imaging device 1 includes the data processing unit 30 that detects the first pixel 13 having a change from the image data captured by the first pixel array 11. The control unit 40 performs control to output a signal photoelectrically converted by the second light receiving pixel 14 corresponding to the first pixel 13 having the change detected by the data processing unit 30. Thus, since the imaging device 1 outputs the signal only from the second light receiving pixel 14 corresponding to a region of interest (ROI) in the visible image, it is possible to appropriately reduce the power consumption required to output the information.

The control unit 40 performs control to, of all the signals read out from the second pixel array 12, output a signal read out from the second light receiving pixel 14 corresponding to the first pixel 13 having a change. Thus, since the imaging device 1 outputs the signal only from the second light receiving pixel 14 corresponding to an ROI region in the visible image, it is possible to appropriately reduce the power consumption required to output the information.

The control unit 40 performs control to, of the signals photoelectrically converted by the second pixel array 12, read out and output the signal photoelectrically converted from the second light receiving pixel 14 corresponding to the first pixel 13 having a change. Thus, since the imaging device 1 reads out, from the second pixel array 12, the signal only from the second light receiving pixel 14 corresponding to an ROI region in the visible image, it is possible to appropriately reduce the power consumption required to read out the information.

The control unit 40 starts driving the second pixel array 12 in the case where the first pixel 13 having a change is detected by the data processing unit 30. Thus, since the imaging device 1 does not drive the second pixel array 12 until the first pixel 13 having the change is detected, the power consumption of the second pixel array 12 can be reduced.

The control unit 40 performs control to output the signal photoelectrically converted from the first pixel array 11 by thinning out some of the first light receiving pixels 13. Thus, the imaging device 1 can reduce the power consumption required to output the signal photoelectrically converted by the first pixel array 11.

The imaging device 1 includes the semiconductor substrate 66, the first pixel array 11, the second pixel array 12, and the control unit 40. In the first pixel array 11, the first light receiving pixel 13 that is provided on the semiconductor substrate 66, has a stacked structure in which the first electrode 77, the photoelectric conversion layer 79, and the second electrode 80 are sequentially stacked, and photoelectrically converts light in the first wavelength region including the visible light region is two-dimensionally arrayed. In the second pixel array 12, the second light receiving pixel 14 that is provided at a position overlapping the first light receiving pixel 13 in the semiconductor substrate 66 in the thickness direction of the semiconductor substrate 66, has light receiving sensitivity different from that of the first light receiving pixel 13, and photoelectrically converts light in the first wavelength region that has passed through the first pixel array 11 is two-dimensionally arrayed. The control unit 40 drives and controls the second pixel array 12 based on the signal photoelectrically converted by the first pixel array 11. Thus, the imaging device 1 can capture the high sensitivity image and the low sensitivity image using one pixel array 10.

The imaging device 1 includes the semiconductor substrate 66, the first pixel array 11, the second pixel array 12, and the control unit 40. In the first pixel array 11, the first light receiving pixel 13 that is provided on the semiconductor substrate 66, has a stacked structure in which the first electrode 77, the photoelectric conversion layer 79, and the second electrode 80 are sequentially stacked, and photoelectrically converts light in the first wavelength region including the visible light region is two-dimensionally arrayed. The second pixel array 12 is provided on the same plane as the first pixel array 11, and the second light receiving pixel 14 that photoelectrically converts light in the second wavelength region including the infrared light region is two-dimensionally arrayed. The control unit 40 drives and controls the second pixel array 12 based on the signal photoelectrically converted by the first pixel array 11. Thus, the imaging device 1 can effectively use the information of the visible light image even when the first pixel array 11 and the second pixel array 12 are arranged on the same plane.

The ranging system 100a includes the light source 101 and the imaging device 1a. The light source 101 emits infrared light. The imaging device 1a images the subject irradiated with infrared light, and measures the distance to the subject based on the captured image. The imaging device 1a includes the semiconductor substrate 66, the first pixel array 11, the second pixel array 12, and the control unit 40a. In the first pixel array 11, the first light receiving pixel 13 that is provided on the semiconductor substrate 66, has a stacked structure in which the first electrode 77, the photoelectric conversion layer 79, and the second electrode 80 are sequentially stacked, and photoelectrically converts light in the first wavelength region including the visible light region is two-dimensionally arrayed. In the second pixel array 12, the second light receiving pixel 14 that is provided at a position overlapping the first light receiving pixel 13 in the semiconductor substrate 66 in the thickness direction of the semiconductor substrate 66, and photoelectrically converts light in the second wavelength region including the infrared light region is two-dimensionally arrayed. The control unit 40a drives and controls the second pixel array 12 and the light source 101 based on the signal photoelectrically converted by the first pixel array 11, and measures the distance to the subject based on the signal photoelectrically converted by the second light receiving pixel 14. Thus, the ranging system 100a can improve the ranging accuracy by effectively using the information of the visible light image and appropriately driving and controlling the light source 101.

Note that the effects described herein are merely examples and are not subject to limitations, and other effects may be provided.

The present technique may also have the following configurations:

(1)
An imaging device including:
a semiconductor substrate;
a first pixel array in which a first light receiving pixel that is provided on the semiconductor substrate, has a stacked structure in which a first electrode, a photoelectric conversion layer, and a second electrode are sequentially stacked, and photoelectrically converts light in a first wavelength region including a visible light region is two-dimensionally arrayed;
a second pixel array in which a second light receiving pixel that is provided at a position overlapping the first light receiving pixel in the semiconductor substrate in the thickness direction of the semiconductor substrate, and photoelectrically converts light in a second wavelength region including an infrared light region is two-dimensionally arrayed; and
a control unit that drives and controls the second pixel array based on a signal photoelectrically converted by the first pixel array.

(2)
The imaging device according to (1) further including
a data processing unit that detects the first light receiving pixel having a change from image data captured by the first pixel array,
wherein
the control unit performs control to
output a signal photoelectrically converted by the second light receiving pixel corresponding to the first light receiving pixel having the change detected by the data processing unit.

(3)
The imaging device according to (2),
wherein
the control unit performs control to, of all signals read out from the second pixel array, output a signal read out from the second light receiving pixel corresponding to the first light receiving pixel having the change.

(4)
The imaging device according to (2),
wherein
the control unit performs control to, of signals photoelectrically converted by the second pixel array, read out and output a signal photoelectrically converted from the second light receiving pixel corresponding to the first light receiving pixel having the change.

(5)
The imaging device according to any one of (2) to (4),
wherein
the control unit starts driving the second pixel array in a case where the first light receiving pixel having the change is detected by the data processing unit.

(6)
The imaging device according to any one of (1) to (5),
wherein
the control unit outputs a signal photoelectrically converted from the first pixel array by thinning out some of the first light receiving pixels.

(7)
An imaging device including:
a semiconductor substrate;
a first pixel array in which a first light receiving pixel that is provided on the semiconductor substrate, has a stacked structure in which a first electrode, a photoelectric conversion layer, and a second electrode are sequentially stacked, and photoelectrically converts light in a first wavelength region including a visible light region is two-dimensionally arrayed;
a second pixel array in which a second light receiving pixel that is provided at a position overlapping the first light receiving pixel in the semiconductor substrate in the thickness direction of the semiconductor substrate, has light receiving sensitivity different from that of the first light receiving pixel, and photoelectrically converts light in the first wavelength region that has passed through the first pixel array is two-dimensionally arrayed; and
a control unit that drives and controls the second pixel array based on a signal photoelectrically converted by the first pixel array.

(8)
An imaging device including:
a semiconductor substrate;
a first pixel array in which a first light receiving pixel that is provided on the semiconductor substrate, has a stacked structure in which a first electrode, a photoelectric conversion layer, and a second electrode are sequentially stacked, and photoelectrically converts light in a first wavelength region including a visible light region is two-dimensionally arrayed;
a second pixel array in which a second light receiving pixel that is provided on the same plane as the first pixel array, and photoelectrically converts light in a second wavelength region including an infrared light region is two-dimensionally arrayed; and
a control unit that drives and controls the second pixel array based on a signal photoelectrically converted by the first pixel array.

(9)
A ranging system including:
a light source that emits infrared light; and
an imaging device that captures an image of a subject irradiated with the infrared light and measures a distance to the subject based on the captured image,
wherein
the imaging device includes:
a semiconductor substrate;
a first pixel array in which a first light receiving pixel that is provided on the semiconductor substrate, including a stacked structure in which a first electrode, a photoelectric conversion layer, and a second electrode are sequentially stacked, and photoelectrically converts light in a first wavelength region including a visible light region is two-dimensionally arrayed;
a second pixel array in which a second light receiving pixel that is provided at a position overlapping the first light receiving pixel in the semiconductor substrate in the thickness direction of the semiconductor substrate, and photoelectrically converts light in the second wavelength region including an infrared light region is two-dimensionally arrayed; and
a control unit that drives and controls the second pixel array and the light source based on a signal photoelectrically converted by the first pixel array, and measures a distance to the subject based on a signal photoelectrically converted by the second light receiving pixel.

REFERENCE SIGNS LIST

100, 100a RANGING SYSTEM
1, 1a IMAGING DEVICE
10 PIXEL ARRAY
11 FIRST PIXEL ARRAY

12 SECOND PIXEL ARRAY
13 FIRST PIXEL
14 SECOND PIXEL
20 AD CONVERSION UNIT
21 FIRST READOUT CIRCUIT
22 FIRST DATA PROCESSING UNIT
23 SECOND READOUT CIRCUIT
24 SECOND DATA PROCESSING UNIT
30 DATA PROCESSING UNIT
40 CONTROL UNIT
41 GLOBAL CONTROL CIRCUIT
42 FIRST ROW CONTROL CIRCUIT
43 SECOND ROW CONTROL CIRCUIT
50 RANGING PULSE GENERATION UNIT
63 COLOR FILTER
65 ON-CHIP LENS
66 SEMICONDUCTOR SUBSTRATE
67 PHOTOELECTRIC CONVERSION REGION
75 OPTICAL FILTER
77 FIRST ELECTRODE
78 SEMICONDUCTOR LAYER
79 PHOTOELECTRIC CONVERSION LAYER
80 SECOND ELECTRODE
81 INSULATING FILM
82 CHARGE ACCUMULATION ELECTRODE
101 LIGHT SOURCE
102 IMAGING OPTICAL SYSTEM
103 ISP
104 INPUT DEVICE
105 DISPLAY DEVICE
106 DATA STORAGE UNIT

The invention claimed is:

1. An imaging device comprising:
a semiconductor substrate;
a first pixel array including a first light receiving pixel arranged above the semiconductor substrate, the first light receiving pixel having a stacked structure including a first electrode, a photoelectric conversion layer, and a second electrode that are sequentially stacked, the first light receiving pixel being configured to photoelectrically converts light in a first wavelength region including a visible light region;
a second pixel array including a second light receiving pixel arranged at a position overlapping the first light receiving pixel in the semiconductor substrate in a thickness direction of the semiconductor substrate, the second light receiving pixel being configured to photoelectrically converts light in a second wavelength region including an infrared light region;
a control unit configured to drive and control the second pixel array based on a signal photoelectrically converted by the first pixel array; and
a data processing unit configured to detect the first light receiving pixel having a change from image data captured by the first pixel array, wherein
the control unit performs control to output a signal photoelectrically converted by the second light receiving pixel corresponding to the first light receiving pixel having the change detected by the data processing unit.

2. The imaging device according to claim 1, wherein the control unit performs control to, of all signals read out from the second pixel array, output a signal read out from the second light receiving pixel corresponding to the first light receiving pixel having the change.

3. The imaging device according to claim 1, wherein the control unit performs control to, of signals photoelectrically converted by the second pixel array, read out and output a signal photoelectrically converted from the second light receiving pixel corresponding to the first light receiving pixel having the change.

4. The imaging device according to claim 1, wherein the control unit starts driving the second pixel array in a case where the first light receiving pixel having the change is detected by the data processing unit.

5. The imaging device according to claim 1, wherein the control unit outputs a signal photoelectrically converted from the first pixel array by thinning out pixels in the first pixel array.

6. An imaging device comprising:
a semiconductor substrate;
a first pixel array including a first light receiving pixel arranged above the semiconductor substrate, the first light receiving pixel having a stacked structure including a first electrode, a photoelectric conversion layer, and a second electrode that are sequentially stacked, the first light receiving pixel being configured to photoelectrically convert light in a first wavelength region including a visible light region;
a second pixel array including a second light receiving pixel arranged at a position overlapping the first light receiving pixel in the semiconductor substrate in a thickness direction of the semiconductor substrate, the second light receiving pixel having a light receiving sensitivity different from that of the first light receiving pixel, the second light receiving pixel being configured to photoelectrically converts light in the first wavelength region that has passed through the first pixel array; and
a control unit configured to drive and control the second pixel array based on a signal photoelectrically converted by the first pixel array.

7. An imaging device comprising:
a semiconductor substrate;
a first pixel array including a first light receiving pixel arranged above the semiconductor substrate, the first light receiving pixel having a stacked structure including a first electrode, a photoelectric conversion layer, and a second electrode that are sequentially stacked, the first light receiving pixel being configured to photoelectrically convert light in a first wavelength region including a visible light region;
a second pixel array including a second light receiving pixel arranged on a same plane as the first pixel array, the second light receiving pixel being configured to photoelectrically convert light in a second wavelength region including an infrared light region; and
a control unit configured to drive and control the second pixel array based on a signal photoelectrically converted by the first pixel array.

8. A ranging system comprising:
a light source that emits infrared light; and
an imaging device that captures an image of a subject irradiated with the infrared light and measures a distance to the subject based on the captured image, wherein
the imaging device includes:
a semiconductor substrate;
a first pixel array including a first light receiving pixel arranged above the semiconductor substrate, the first light receiving pixel having a stacked structure including a first electrode, a photoelectric conversion layer, and a second electrode that are sequentially stacked, the first light receiving pixel being configured to photoelectrically convert light in a first wavelength region including a visible light region;

a second pixel array including a second light receiving pixel arranged at a position overlapping the first light receiving pixel in the semiconductor substrate in a thickness direction of the semiconductor substrate, the second light receiving pixel being configured to photoelectrically converts light in a second wavelength region including an infrared light region;

a control unit configured to drive and control the second pixel array and the light source based on a signal photoelectrically converted by the first pixel array, and to measures a distance to the subject based on a signal photoelectrically converted by the second light receiving pixel; and a data processing unit configured to detect the first light receiving pixel having a change from image data captured by the first pixel array, wherein the control unit performs control to output a signal photoelectrically converted by the second light receiving pixel corresponding to the first light receiving pixel having the change detected by the data processing unit.

* * * * *